(12) United States Patent
Hung et al.

(10) Patent No.: US 12,557,672 B2
(45) Date of Patent: Feb. 17, 2026

(54) ELECTRONIC DEVICE HAVING SUBSTRATE

(71) Applicant: INDUSTRIAL TECHNOLOGY RESEARCH INSTITUTE, Hsinchu (TW)

(72) Inventors: Tsung-Yi Hung, Zhubei (TW); Shih-Hsien Wu, Taoyuan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 576 days.

(21) Appl. No.: 17/550,474

(22) Filed: Dec. 14, 2021

(65) Prior Publication Data
US 2023/0187361 A1 Jun. 15, 2023

(51) Int. Cl.
*H01L 23/538* (2006.01)
*H01L 25/10* (2006.01)

(52) U.S. Cl.
CPC ...... *H01L 23/5382* (2013.01); *H01L 23/5384* (2013.01); *H01L 23/5386* (2013.01);
(Continued)

(58) Field of Classification Search
CPC ............. H01L 23/5382; H01L 23/5384; H01L 23/5386; H01L 25/105
See application file for complete search history.

(56) References Cited

U.S. PATENT DOCUMENTS

| 8,476,735 B2 | 7/2013 | Hsu et al. |
| 8,810,269 B2 | 8/2014 | Gong et al. |

(Continued)

FOREIGN PATENT DOCUMENTS

| CN | 1362785 A | 8/2002 |
| CN | 104335334 A | 2/2015 |

(Continued)

OTHER PUBLICATIONS

TW Office Action dated Aug. 18, 2023 as received in Application No. 111125669.
(Continued)

*Primary Examiner* — Trang Q Tran
(74) *Attorney, Agent, or Firm* — Maschoff Brennan (57) ABSTRACT

An electronic device includes a substrate, an outer layer, a conductive line layer, and a switchable circuit chip. The substrate has a plurality of having a plurality of first vias. The outer layer is disposed on a side of the substrate and has a plurality of second vias. The first vias have a larger distribution density or quantity than the second vias, so that a part of the first vias are electrically connected to the second vias, and another part of the first vias are electrically floating. The conductive line layer is disposed on the outer layer and has a plurality of conductive traces. The conductive traces are electrically connected to the second vias. The switchable circuit chip is electrically connected to the first vias. The conductive traces are electrically connected to the switchable circuit chip. The switchable circuit chip is configured for controlling an electrical connecting relationship between the conductive traces and the first vias and an electrical connecting relationship among the conductive traces.

22 Claims, 9 Drawing Sheets

(52) U.S. Cl.
CPC .... *H01L 25/105* (2013.01); *H01L 2225/1041* (2013.01); *H01L 2225/1058* (2013.01)

(56) References Cited

U.S. PATENT DOCUMENTS

| | | |
|---|---|---|
| 9,064,715 B2 | 6/2015 | Lee et al. |
| 9,106,229 B1 | 8/2015 | Hutton et al. |
| 9,633,872 B2 | 4/2017 | Chen et al. |
| 9,806,128 B2 | 10/2017 | Tan et al. |
| 9,842,784 B2 | 12/2017 | Nasrullah et al. |
| 10,354,961 B2 | 7/2019 | Yu et al. |
| 10,749,528 B2 | 8/2020 | Atsatt |
| 10,950,588 B2 | 3/2021 | Yu et al. |
| 2013/0182402 A1 | 7/2013 | Chen et al. |
| 2016/0093572 A1* | 3/2016 | Chen ................. H01L 23/5389 |
| | | 438/126 |
| 2018/0102776 A1 | 4/2018 | Chandrasekar et al. |
| 2020/0135709 A1* | 4/2020 | Lee .................... H01L 23/5384 |
| 2022/0375865 A1* | 11/2022 | Pietambaram ...... H01L 25/0652 |

FOREIGN PATENT DOCUMENTS

| | | |
|---|---|---|
| CN | 109391260 A | 2/2019 |
| JP | H10178114 A | 6/1998 |
| JP | 2010021468 A | 1/2010 |
| TW | 201830639 A | 8/2018 |
| TW | 201947731 A | 12/2019 |
| TW | 202042355 A | 11/2020 |

OTHER PUBLICATIONS

CN Office Action dated Nov. 21, 2025 in application No. 202210904340.1.

\* cited by examiner

ELECTRONIC DEVICE HAVING SUBSTRATE

TECHNICAL FIELD

The disclosure relates to an electronic device, and relates to an electronic device having a substrate including an array of vias.

BACKGROUND

Conventionally, an external electrical component is mounted on a substrate having vias, and the external electrical component can be operated by giving the vias a predetermined potential. The quantity and arrangement of the vias on the substrate were determined by considering the configuration of the external electrical component.

That is, the arrangement of vias on the typical substrate has to be customized for the external electrical component. Therefore, it requires to spend extra time and cost on developing and manufacturing substrates with various arrangements of vias customized for different configurations of external electrical components.

SUMMARY

One embodiment of the disclosure provides an electronic device including a substrate, an outer layer, a conductive line layer, and a switchable circuit chip. The substrate has a plurality of first vias. The outer layer has a plurality of second vias. The outer layer is disposed on a side of the substrate. The first vias have a larger distribution density or quantity than the second vias, so that a part of the first vias are electrically connected to the second vias, and another part of the first vias are electrically floating. The conductive line layer is disposed on the outer layer. The conductive line layer has a plurality of conductive traces. At least one of the conductive traces is electrically connected to at least one of the second vias. The switchable circuit chip is electrically connected to at least one of the first vias. At least one plurality of the conductive traces of the conductive line layer are electrically connected to the switchable circuit chip. The switchable circuit chip is configured for controlling an electrical connecting relationship between at least one plurality of the conductive traces and at least one of the first vias.

The above description about the content of the disclosure and the following description about the embodiments are used to demonstrate and explain the spirit and principle of the disclosure and provide a further explanation of the scope of claims of the disclosure.

BRIEF DESCRIPTION OF THE DRAWINGS

The disclosure will become better understood from the detailed description given hereinbelow and the accompanying drawings which are given by way of illustration only and thus are not intending to limit the disclosure and wherein.

DETAILED DESCRIPTION

Features and advantages of embodiments of the disclosure are described in the following detailed description, it allows the person skilled in the art to understand the technical contents of the embodiments of the disclosure and implement them, and the person skilled in the art can easily comprehend the purposes of the advantages of the disclosure. The following embodiments are further illustrating the perspective of the disclosure, but not intending to limit the disclosure.

The drawings may not be drawn to actual size or scale, some exaggerations may be necessary in order to emphasize basic structural relationships, while some are simplified for clarity of understanding, and the disclosure is not limited thereto. It is allowed to have various adjustments under the spirit of the disclosure. In addition, the spatially relative terms, such as "up", "top", "above", "down", "low", "left", "right", "front", "rear", and "back" and the like, may be used herein for ease of description to describe the relationship of one element or feature to another element(s) of feature(s) as illustrated in the drawings. It will be understood that the spatially relative terms are intended to encompass orientations of the element or feature but not intended to limit the disclosure.

Figure 1:
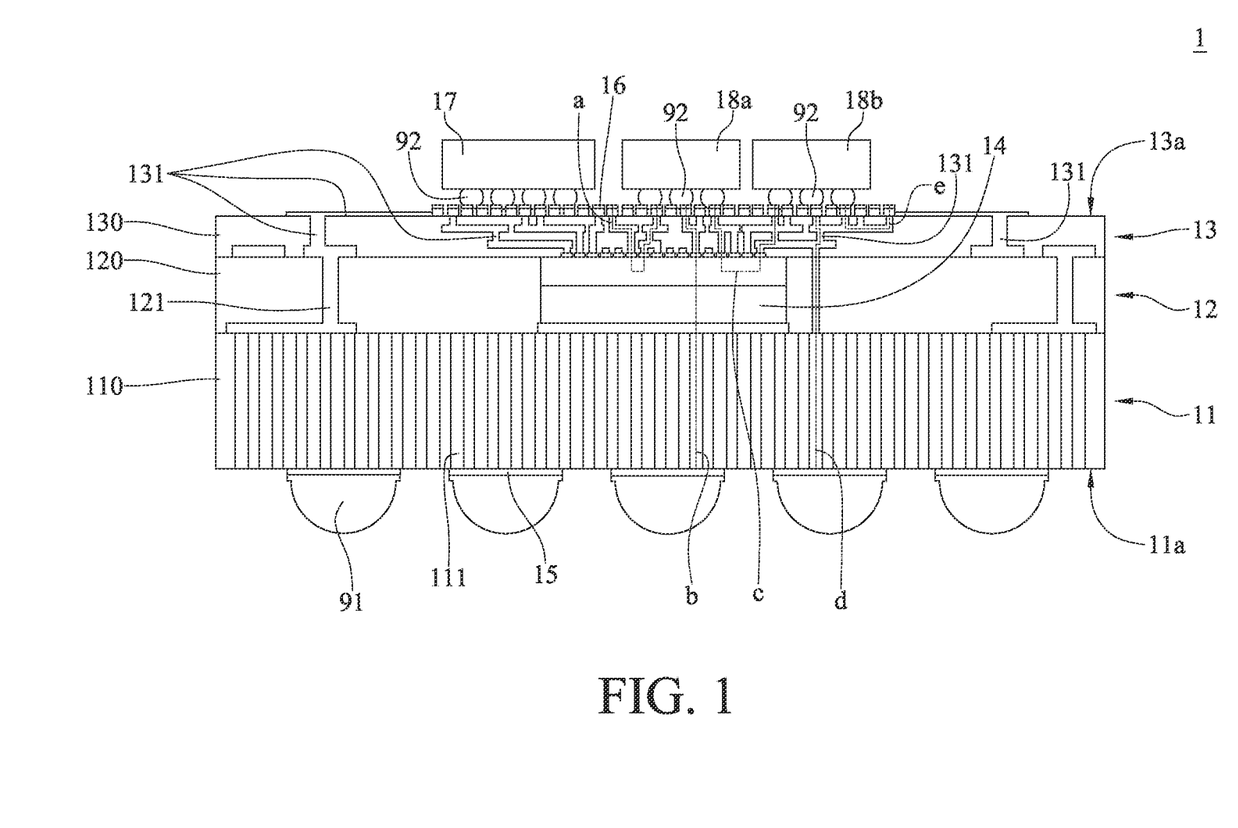
FIG. 1 illustrates a schematic cross-sectional view of an electronic device having a substrate according to one embodiment of the disclosure.

Please refer to FIG. 1. FIG. 1 illustrates a schematic cross-sectional view of an electronic device having a substrate according to one embodiment of the disclosure.

As shown in FIG. 1, in the embodiment, the electronic device 1 includes a substrate 11, an outer layer 12, a conductive line layer 13, a switchable circuit chip 14, a plurality of first external bumps 15, a plurality of second external bumps 16, an operating chip 17, and external electronic elements 18a, 18b.

The substrate 11 includes a core layer 110 and a plurality of first vias 111. The core layer 110 is made of a material selected from a group consisting of a semiconductor material and a non-conductive material. The core layer 110 is made of a material selected from a group consisting of silicon, gallium, germanium, gallium nitride, and epoxy resin. The first vias 111 passes through the core layer 110 and are arranged in an array. Each of the first vias 111 is solid. Each of the first vias 111 has an outer diameter ranging from 5 μm to 100 μm. A center distance between every two of the first vias 111 adjacent to each other is in micrometer scale.

The switchable circuit chip 14 is disposed on the substrate 11. The switchable circuit chip 14 is directly electrically connected to the first vias 111. The outer layer 12 is disposed on a side of the substrate 11 and surrounds the switchable circuit chip 14, so that the switchable circuit chip 14 is disposed in the outer layer 12. The outer layer 12 includes a first dielectric 120 and a plurality of second vias 121. The first dielectric 120 contacts each of the second vias 121. The first dielectric 120 is made of a polymer or a molding compound. The polymer is selected from a group consisting of polybenzoxazole and polyimide. Each of the second vias 121 is electrically connected to more than one of the first vias 111 in a one-to-plurality manner. The first vias 111 have a larger distribution density or quantity than the second vias 121, so that some of the first vias 111 are electrically connected to the second vias 121, and the others of the first vias 111 are not electrically connected to the second vias 121.

The conductive line layer 13 is disposed on the outer layer 12 and covers the switchable circuit chip 14 and the outer layer 12. The conductive line layer 13 includes a second dielectric 130 and a plurality of conductive traces 131. The second dielectric 130 contacts each of the conductive traces 131. The second dielectric 130 is made of the polymer or the molding compound. Some of the conductive traces 131 are electrically connected to the switchable circuit chip 14. Others of the conductive traces 131 are electrically connected to the second vias 121. The switchable circuit chip 14 is configured for controlling an electrical connecting relationship between the conductive traces 131 and the first vias 111. Moreover, the switchable circuit chip 14 is also configured for controlling an electrical connecting relationship among the conductive traces 131.

The first external bumps 15 are disposed on a surface 11a of the substrate 11 and located away from the conductive line layer 13. The first external bumps 15 are electrically connected to the first vias 111. A plurality of first solders 91 are disposed on the first external bumps 15. The first external bumps 15 are made of UBM (Under Bump Metallurgy). Some of the first vias 111 are not electrically connected to the switchable circuit chip 14, not electrically connected to the second vias 121, and not electrically connected to the first external bumps 15, and thus are electrically floating.

The second external bumps 16 are disposed on a surface 13a of the conductive line layer 13 and located away from the substrate 11. The second external bumps 16 are electrically connected to the conductive traces 131. The operating chip 17 is disposed on the conductive line layer 13 and electrically connected to the second external bumps 16 through a plurality of second solders 92. The operating chip 17 is electrically connected to the switchable circuit chip 14 through the second solders 92, the second external bumps 16, and the conductive traces 131. The external electronic elements 18a, 18b are disposed on the conductive line layer 13 and electrically connected to the second external bumps 16 through the second solders 92. Each of the external electronic elements 18a, 18b is electrically connected to the switchable circuit chip 14 through the second solders 92, the second external bumps 16, and the conductive traces 131.

During the operation of the electronic device 1, signals may be transmitted along any path for example a path a, a path b, a path c, a path d, and a path e as shown.

In the path a, the external electronic element 18a is electrically connected to one of the second external bumps 16 through another of the second external bumps 16, one of the conductive traces 131, the switchable circuit chip 14, and another of the conductive traces 131. Therefore, for example the operating chip 17 may control the switchable circuit chip 14 to provide the path a as a routing path between the external electronic element 18a and other electronic device not shown according to different conditions and requirements.

In the path b, the external electronic element 18a is electrically connected to one of the first external bumps 15 through one of the second external bumps 16, one of the conductive traces 131, the switchable circuit chip 14, and one of the first vias 111. Therefore, for example the operating chip 17 may control the switchable circuit chip 14 to provide the path b as a routing path between the external electronic element 18a and other electronic device not shown according to different conditions and requirements.

In the path c, the external electronic element 18a is electrically connected to the external electronic element 18b through one of the second external bumps 16, one of the conductive traces 131, the switchable circuit chip 14, another of the conductive traces 131, and another of the second external bumps 16. In other words, the external electronic element 18a and the external electronic element 18b are electrically connected to each other through a plurality of the second external bumps 16, a plurality of the conductive traces 131, and the switchable circuit chip 14. Therefore, for example the operating chip 17 may control the switchable circuit chip 14 to provide the path c as a routing path between the external electronic element 18a and the external electronic element 18b according to different conditions and requirements.

In the path d, the external electronic element 18b is electrically connected to one of the first external bumps 15 through one of the second external bumps 16, one of the conductive traces 131, one of the second vias 121, and one of the first vias 111. Therefore, for example the path d may be provided as a routing path between the external electronic element 18b and other electronic device not shown according to different conditions and requirements.

In the path e, the external electronic element 18b is electrically connected to one of the second external bumps 16 through another of the second external bumps 16 and one of the conductive traces 131. Therefore, for example the path e may be provided as a routing path between the external electronic element 18b and other electronic device not shown according to different conditions and requirements.

Figure 2:
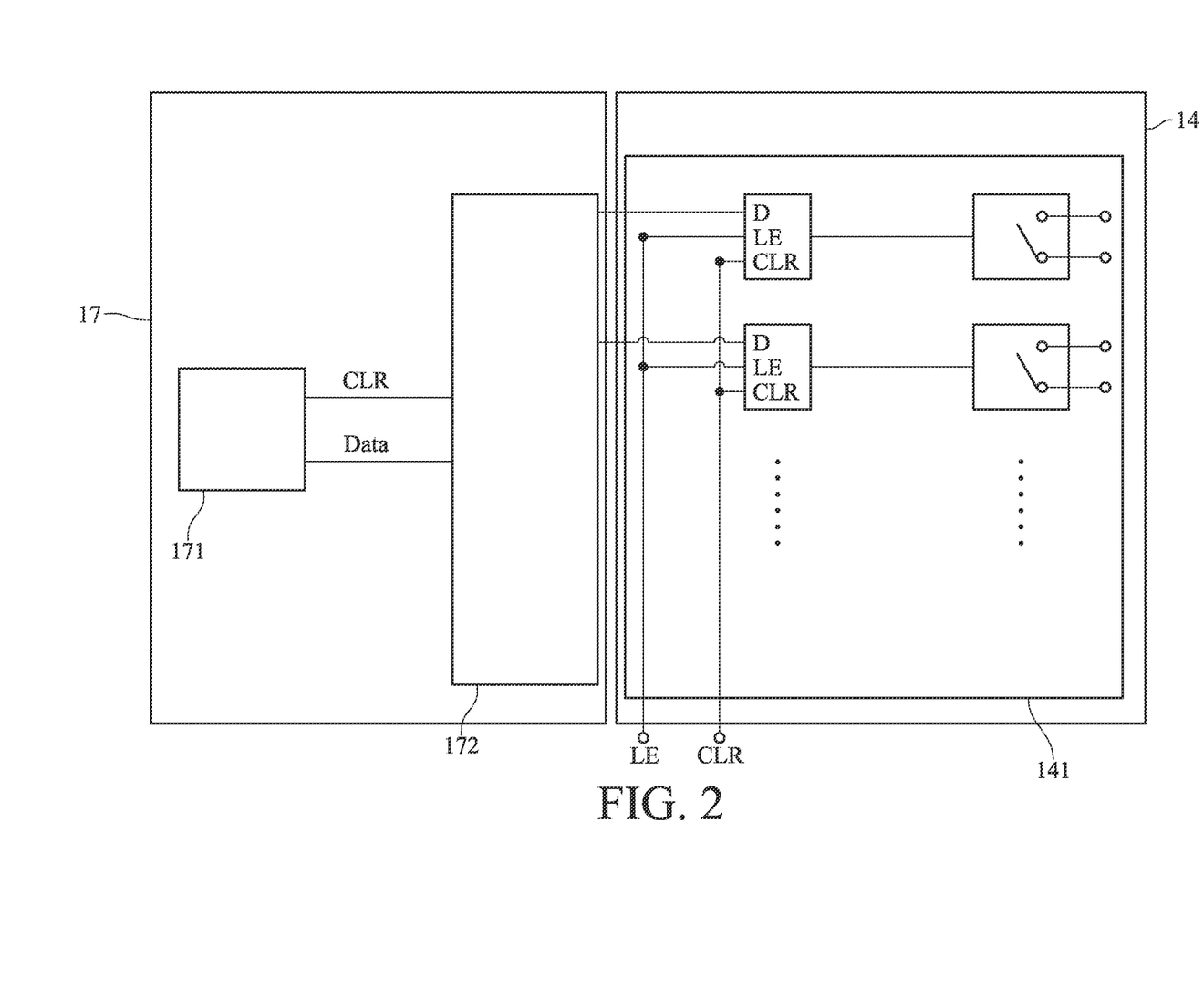
FIG. 2 illustrates a schematic block diagram of an operating chip and a switchable circuit chip of the electronic device in FIG. 1.
Figure 3:
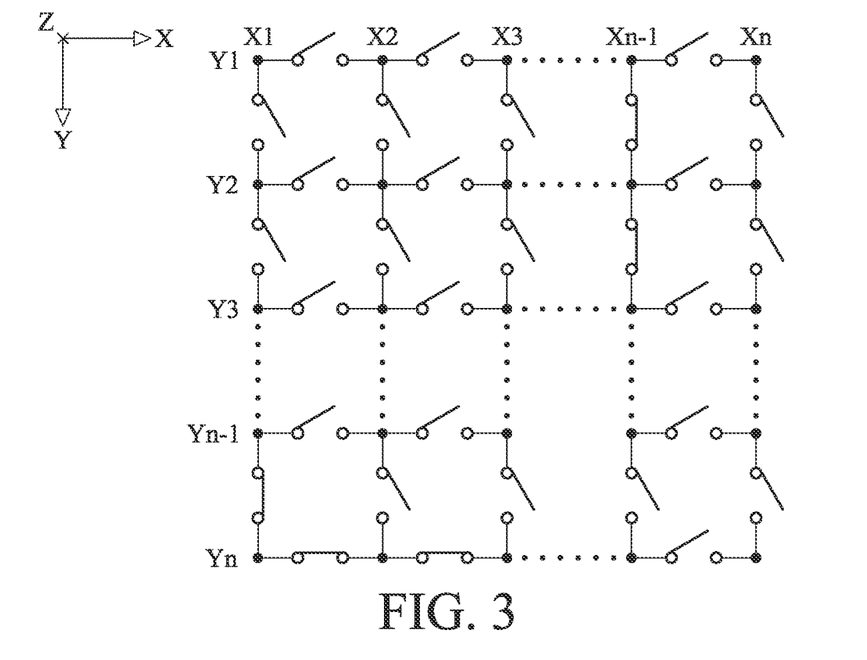
FIG. 3 illustrates a schematic diagram of a switch array of the switchable circuit chip in an XY plane.
Figure 4:
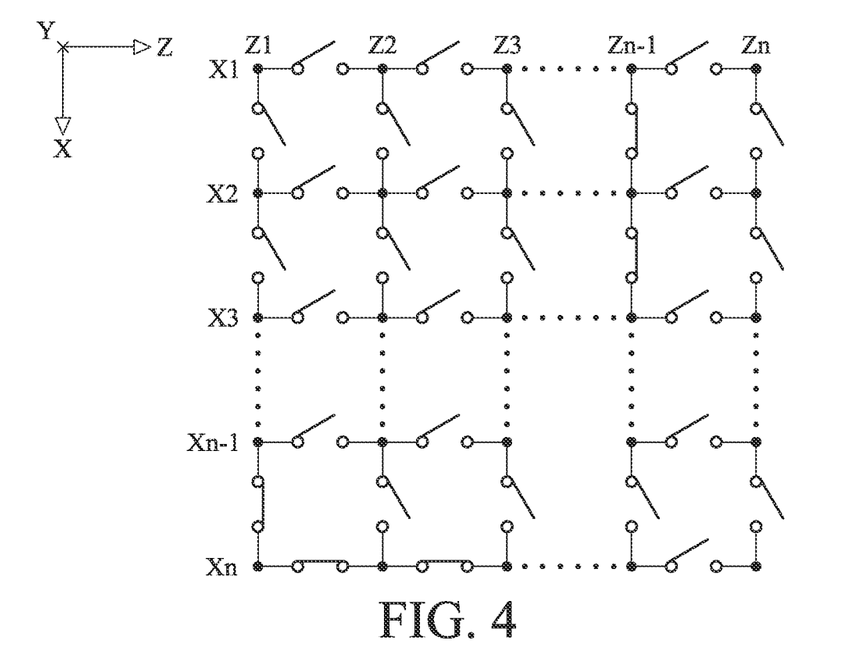
FIG. 4 illustrates a schematic diagram of the switch array of the switchable circuit chip in a ZX plane.

Please refer to FIG. 2, FIG. 3, and FIG. 4. FIG. 2 illustrates a schematic block diagram of an operating chip and a switchable circuit chip of the electronic device in FIG. 1. FIG. 3 illustrates a schematic diagram of a switch array of the switchable circuit chip in an XY plane. FIG. 4 illustrates a schematic diagram of the switch array of the switchable circuit chip in a ZX plane.

As shown in FIG. 2, in the embodiment, the switchable circuit chip 14 includes a switch array 141. As can be seen in the XY plane in FIG. 3, the switch array 141 has n nodes arranged along an X direction and n nodes arranged along a Y direction, and a switch is provided between every two of the nodes adjacent to each other. As can be seen in the ZX plane in FIG. 4, the switch array 141 has n nodes arranged along a Z direction and n nodes arranged along the X direction, and a switch is provided between every two of the nodes adjacent to each other.

As shown in FIG. 2, by selectively switching on or off of one or more of the switches shown in FIG. 3 and FIG. 4, the switch array 141 are able to offer a plurality of connecting path configurations. The operating chip 17 includes a memory unit 171 and a controlling unit 172 electrically connected to the memory unit 171. The memory unit 171 stores a configuration command. The controlling unit 172 may turn on or off one or more selected switches of the switch array 141 according to the configuration command received from the memory unit 171, thereby forming a required connecting path configuration. In other words, the controlling unit 172 is configured for enabling one of the connecting path configurations according to the configuration command. When it requires the switch array 141 to provide a different connecting path configuration, one approach is to adapt another operating chip 17 of having a memory unit 171 storing another configuration command; an alternative approach is to rewrite the configuration command of the original memory unit 171.

In addition, in the case that the configuration command stored in the memory unit 171 of the operating chip 17 involve manufacturer's secrets, the part of the electronic device 1 other than the operating chip 17 may be assembled and shipped separately from the operating chip 17, such that the operating chip 17 may be installed to the electronic device 1 when arriving at a designated place, and thereby preventing leakage of the configuration command.

Figure 5:
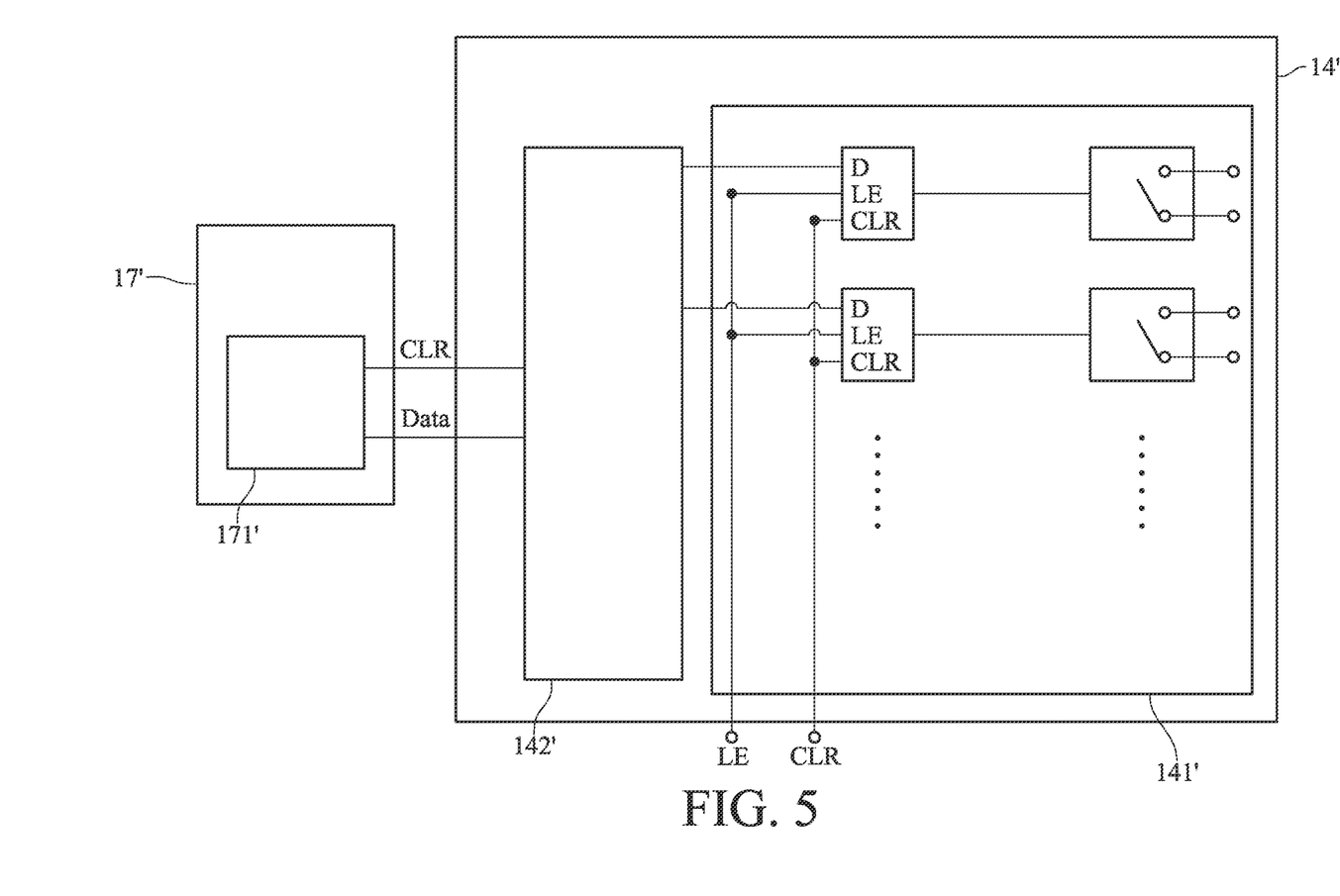
FIG. 5 illustrates a schematic block diagram of another operating chip and another switchable circuit chip of the electronic device in FIG. 1.

Please refer to FIG. 5. FIG. 5 illustrates a schematic block diagram of another operating chip and another switchable circuit chip of the electronic device in FIG. 1.

As shown in FIG. 5, in the embodiment, the switchable circuit chip 14' includes a switch array 141' and a controlling unit 142' electrically connecting to the switch array 141'. The switch array 141' are able to offer a plurality of connecting path configurations. The operating chip 17' includes a memory unit 171'. The memory unit 171' stores a configuration command. The controlling unit 142' may turn on or off one or more selected switches of the switch array 141' according to the configuration command received from the memory unit 171', thereby forming a required connecting path configuration. In other words, the controlling unit 142' is configured for enabling one of the connecting path configurations according to the configuration command.

In other embodiment, the operating chip 17' may be absent, and the switchable circuit chip 14 may include a switch array, a memory unit, and a controlling unit electrically connected to the switch array and the memory unit. In the switchable circuit chip 14, the controlling unit may turn on or off one or more selected switches of the switch array according to the configuration command received from the memory unit, thereby forming a required connecting path configuration.

Figure 6:
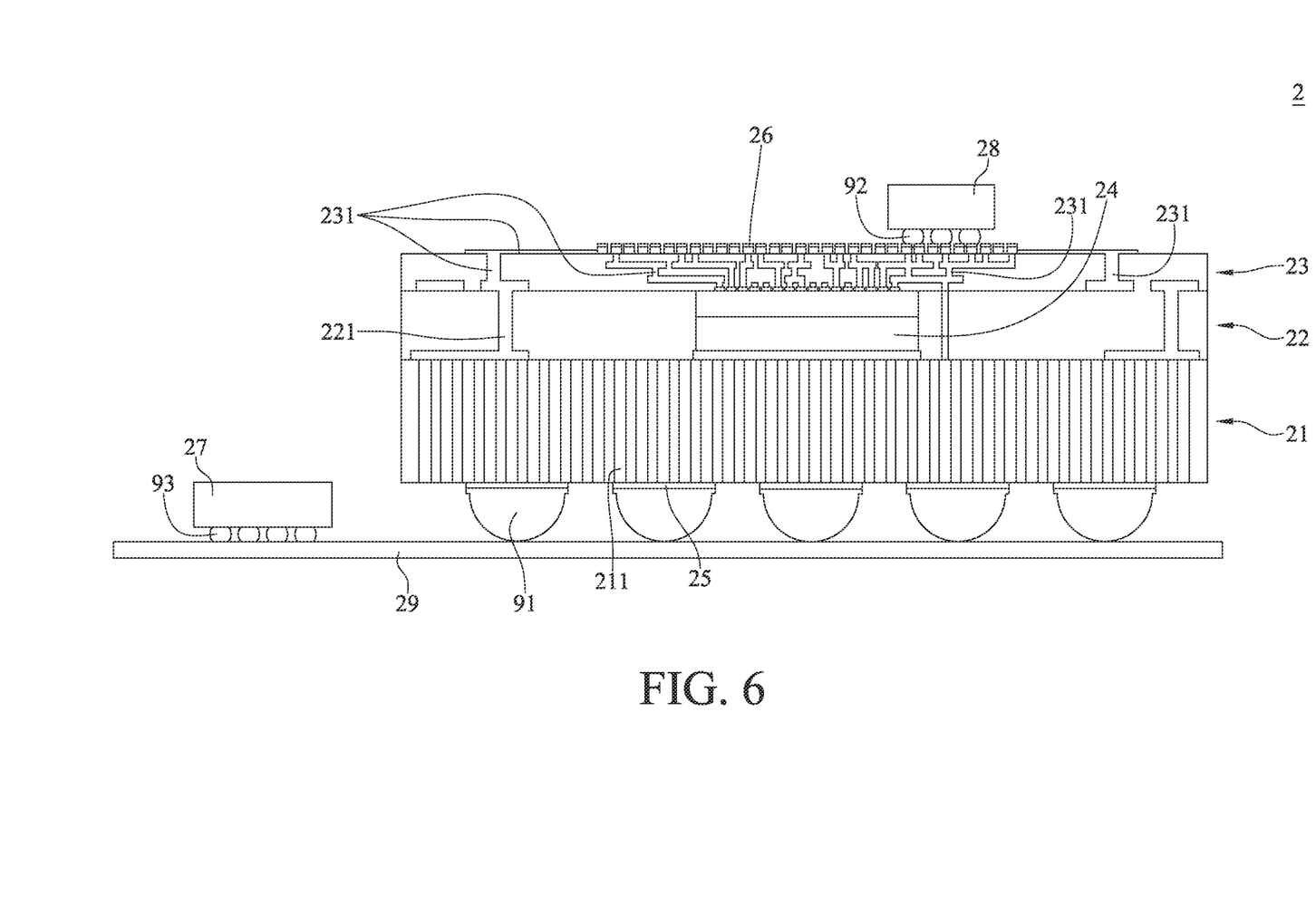
FIG. 6 illustrates a schematic cross-sectional view of an electronic device having a substrate according to another embodiment of the disclosure.

Please refer to FIG. 6. FIG. 6 illustrates a schematic cross-sectional view of an electronic device having a substrate according to another embodiment of the disclosure.

As shown in FIG. 6, in the embodiment, the electronic device 2 includes a substrate 21, an outer layer 22, a conductive line layer 23, a switchable circuit chip 24, a plurality of first external bumps 25, a plurality of second external bumps 26, an operating chip 27, an external electronic element 28, and a circuit board 29. In the embodiment, the substrate 21 and first vias 211 thereof, the outer layer 22 and second vias 221 thereof, the conductive line layer 23 and conductive traces 231 thereof, the switchable circuit chip 24, the first external bumps 25, and the second external bumps 26 are respectively similar to the substrate 11 and the first vias 111 thereof, the outer layer 12 and the second vias 121 thereof, the conductive line layer 13 and the conductive traces 131 thereof, the switchable circuit chip 14, the first external bumps 15, and the second external bumps 16 as shown in FIG. 1, and thus the description thereof is not repeated.

Both of the operating chip 27 and the substrate 21 are disposed on the circuit board 29. The operating chip 27 is electrically connected to the switchable circuit chip 24 through the a plurality of third solders 93, the circuit board 29, the first solders 91, the first external bumps 25, and the substrate 21. The external electronic element 28 is disposed on the conductive line layer 23 and electrically connected to the second external bumps 26 through the second solders 92. The external electronic element 28 is electrically connected to the switchable circuit chip 24 through the second solders 92, the second external bumps 26, and the conductive traces 231.

In the embodiment, an operation of the switchable circuit chip 24 and the operating chip 27 is similar to the operation of the switchable circuit chip 14 and the operating chip 17 as shown in FIG. 2, and thus the description thereof is not repeated. In another embodiment, the operation of the switchable circuit chip 24 and the operating chip 27 may be also similar to the operation of the switchable circuit chip 14' and the operating chip 17' as shown in FIG. 5, and thus the description thereof is not repeated.

Figure 7:
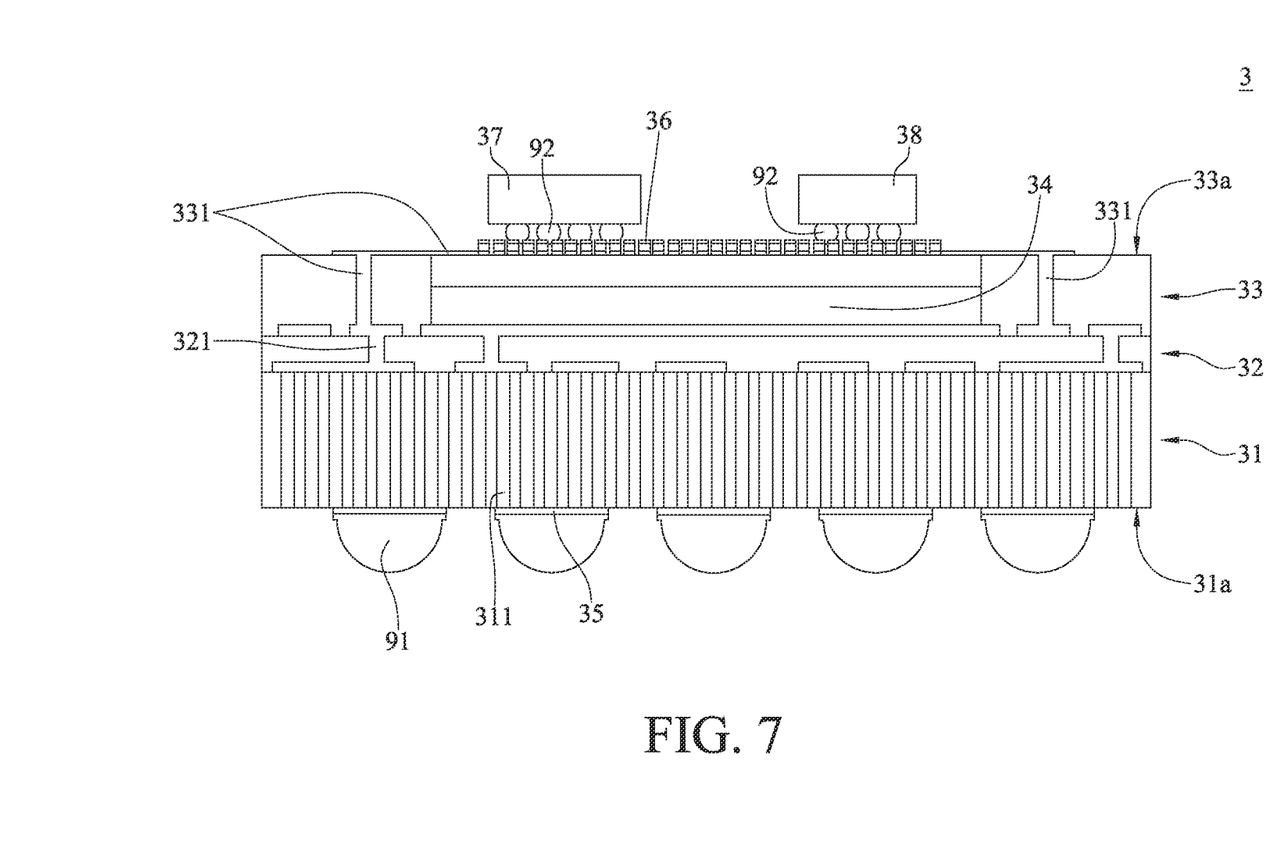
FIG. 7 illustrates a schematic cross-sectional view of an electronic device having a substrate according to another embodiment of the disclosure.

Please refer to FIG. 7. FIG. 7 illustrates a schematic cross-sectional view of an electronic device having a substrate according to another embodiment of the disclosure.

As shown in FIG. 7, in the embodiment, the electronic device 3 includes a substrate 31, an outer layer 32, a conductive line layer 33, a switchable circuit chip 34, a plurality of first external bumps 35, a plurality of second external bumps 36, an operating chip 37, and an external electronic element 38.

The substrate 31 includes a plurality of first vias 311. The outer layer 32 is disposed on a side of the substrate 31. The outer layer 32 includes a plurality of second vias 321. Each of the second vias 321 is electrically connected to more than one of the first vias 311 in a one-to-plurality manner. The first vias 311 have a larger distribution density or quantity than the second vias 321, so that some of the first vias 311 are electrically connected to the second vias 321, and the others of the first vias 311 are not electrically connected to the second vias 321.

The switchable circuit chip 34 is disposed on the outer layer 32. The switchable circuit chip 34 is electrically connected to the first vias 311 through the second vias 321. The conductive line layer 33 covers the switchable circuit chip 34 and the outer layer 32. The conductive line layer 33 includes a plurality of conductive traces 331. Some of the conductive traces 331 are electrically connected to the switchable circuit chip 34. Others of the conductive traces 331 are electrically connected to the second vias 321. The switchable circuit chip 34 is configured for controlling an electrical connecting relationship between the conductive traces 331 and the first vias 311. Moreover, the switchable circuit chip 34 is also configured for controlling an electrical connecting relationship among the conductive traces 331.

The first external bumps 35 are disposed on a surface 31a of the substrate 31 and located away from the conductive line layer 33. The first external bumps 35 are electrically connected to the first vias 311. Some of the first vias 311 are not electrically connected to the switchable circuit chip 34, not electrically connected to the second vias 321, and not electrically connected to the first external bumps 35, and thus are electrically floating.

The second external bumps 36 are disposed on a surface 33a of the conductive line layer 33 and located away from the substrate 31. The second external bumps 36 are electrically connected to the conductive traces 331. Some of the conductive traces 331 electrically connect the switchable circuit chip 34 and some of the second external bumps 36. Others of the conductive traces 331 electrically connect the second vias 321 and others of the second external bumps 36.

The operating chip 37 is disposed on the conductive line layer 33 and electrically connected to the second external bumps 36 through the second solders 92. The operating chip 37 is electrically connected to the switchable circuit chip 34 through the second solders 92, the second external bumps 36, and the conductive traces 331. The external electronic element 38 is disposed on the conductive line layer 33 and electrically connected to the second external bumps 36 through the second solders 92. The external electronic element 38 is electrically connected to the switchable circuit chip 34 through the second solders 92, the second external bumps 36, and the conductive traces 331.

In the embodiment, an operation of the switchable circuit chip 34 and the operating chip 37 is similar to the operation of the switchable circuit chip 14 and the operating chip 17 as shown in FIG. 2, and thus the description thereof is not repeated. In another embodiment, the operation of the switchable circuit chip 34 and the operating chip 37 may be also similar to the operation of the switchable circuit chip 14' and the operating chip 17' as shown in FIG. 5, and thus the description thereof is not repeated.

Figure 8:
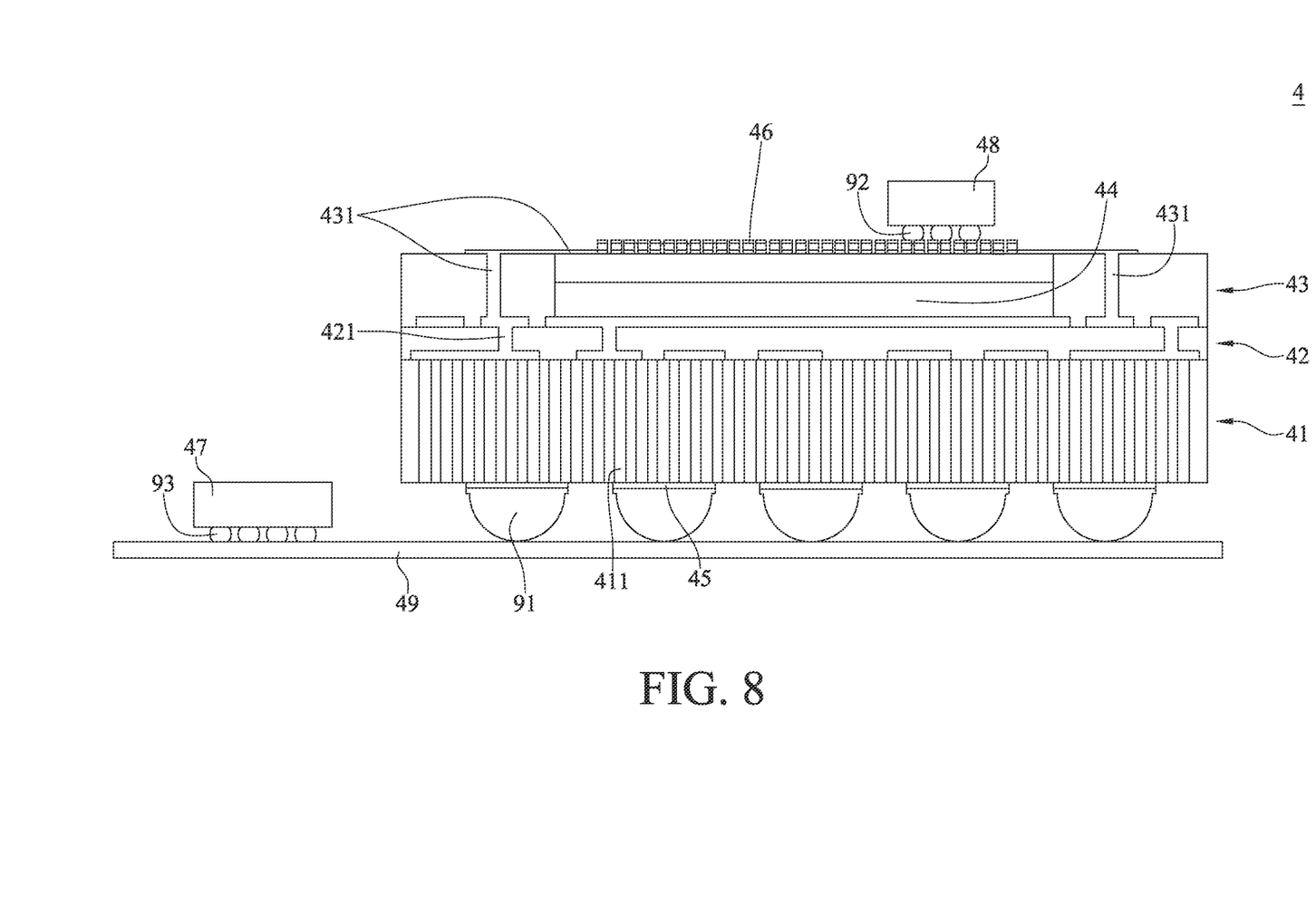
FIG. 8 illustrates a schematic cross-sectional view of an electronic device having a substrate according to another embodiment of the disclosure.

Please refer to FIG. 8. FIG. 8 illustrates a schematic cross-sectional view of an electronic device having a substrate according to another embodiment of the disclosure.

As shown in FIG. 8, in the embodiment, the electronic device 4 includes a substrate 41, an outer layer 42, a conductive line layer 43, a switchable circuit chip 44, a plurality of first external bumps 45, a plurality of second external bumps 46, an operating chip 47, an external electronic element 48, and a circuit board 49. In the embodiment, the substrate 41 and the first vias 411 thereof, the outer layer 42 and the second vias 421 thereof, the conductive line layer 43 and the conductive traces 431 thereof, the switchable circuit chip 44, the first external bumps 45, and the second external bumps 46 are respectively similar to the substrate 31 and the first vias 311 thereof, the outer layer 32 and the second vias 321 thereof, the conductive line layer 33 and the conductive traces 331 thereof, the switchable circuit chip 34, the first external bumps 35, and the second external bumps 36 as shown in FIG. 7, and thus the description thereof is not repeated.

Both of the operating chip 47 and the substrate 41 are disposed on the circuit board 49. The operating chip 47 is electrically connected to the switchable circuit chip 44 through the third solders 93, the circuit board 49, the first solders 91, the first external bumps 45, and the substrate 41. The external electronic element 48 is disposed on the conductive line layer 43 and electrically connected to the second external bumps 46 through the second solders 92. The external electronic element 48 is electrically connected to the switchable circuit chip 44 through the second solders 92, the second external bumps 46, and the conductive traces 431.

In the embodiment, an operation of the switchable circuit chip 44 and the operating chip 47 is similar to the operation of the switchable circuit chip 14 and the operating chip 17 as shown in FIG. 2, and thus the description thereof is not repeated. In another embodiment, the operation of the switchable circuit chip 44 and the operating chip 47 may be also similar to the operation of the switchable circuit chip 14' and the operating chip 17' as shown in FIG. 5, and thus the description thereof is not repeated.

Figure 9:
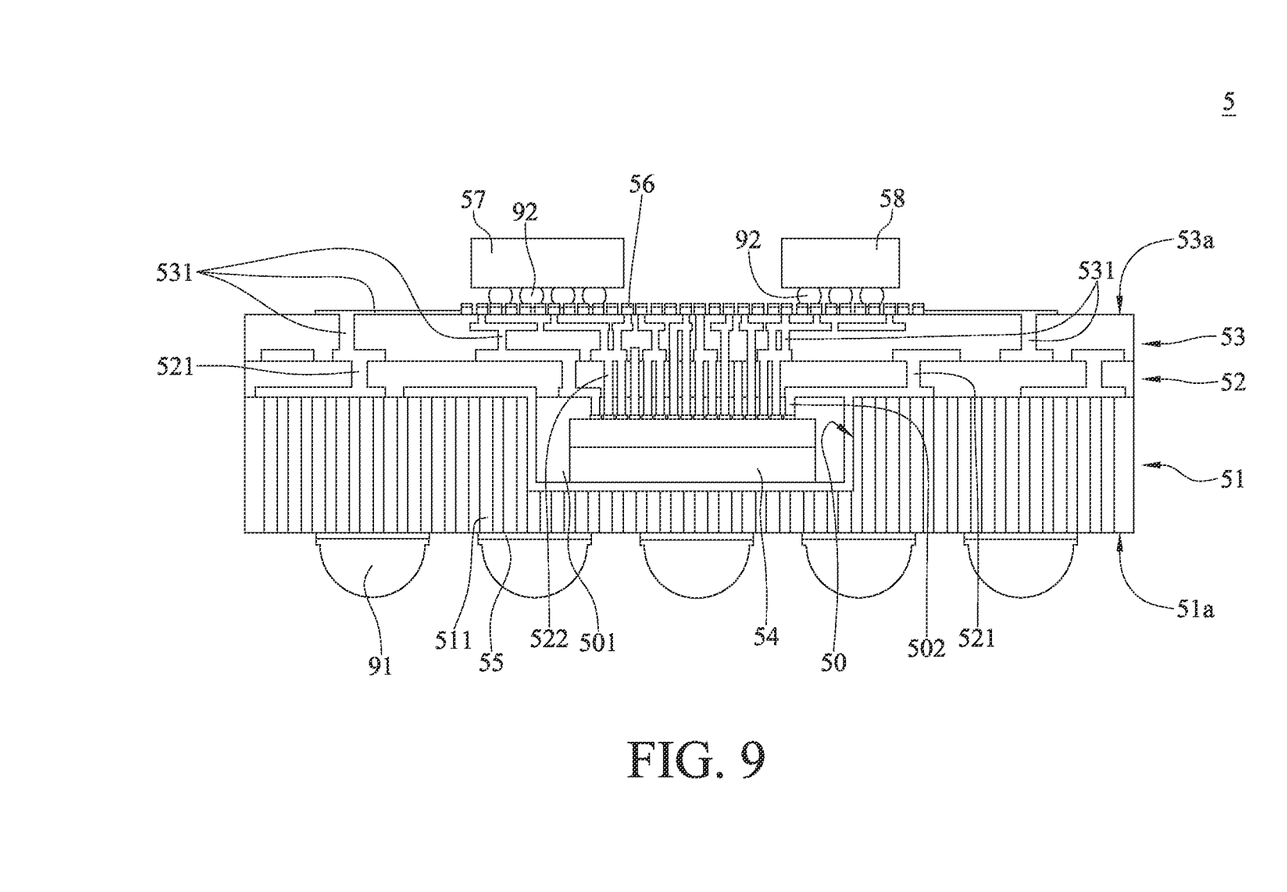
FIG. 9 illustrates a schematic cross-sectional view of an electronic device having a substrate according to another embodiment of the disclosure.

Please refer to FIG. 9. FIG. 9 illustrates a schematic cross-sectional view of an electronic device having a substrate according to another embodiment of the disclosure.

As shown in FIG. 9, in the embodiment, the electronic device 5 includes a substrate 51, an outer layer 52, a conductive line layer 53, a switchable circuit chip 54, a plurality of first external bumps 55, a plurality of second external bumps 56, an operating chip 57, and an external electronic element 58.

The substrate 51 includes a plurality of first vias 511 has a cavity 50. The switchable circuit chip 54 is disposed in the cavity 50 and directly electrically connected to the first vias 511. The filler 501 is filled in the cavity 50 and surrounds the switchable circuit chip 54. The outer layer 52 is disposed on a side of the substrate 51 and covers the switchable circuit chip 54 and the substrate 51. The outer layer 52 includes a plurality of second vias 521 and a plurality of third vias 522. Each of the second vias 521 is electrically connected to more than one of the first vias 511 in a one-to-plurality manner. The first vias 511 have a larger distribution density or quantity than the second vias 521, so that some of the first vias 511 are electrically connected to the second vias 521, and the others of the first vias 511 are not electrically connected to the second vias 521. A plurality of conductive traces 502 electrically connect the switchable circuit chip 54 and a plurality of the third vias 522. Each of the third vias 522 is electrically connected to each of the conductive traces 502 in a one-to-one manner.

The conductive line layer 53 is disposed on the outer layer 52. The conductive line layer 53 includes a plurality of conductive traces 531. Some of the conductive traces 531 are electrically connected to the switchable circuit chip 54 through the third vias 522. Others of the conductive traces 531 are electrically connected to the second vias 521. The switchable circuit chip 54 is configured for controlling an electrical connecting relationship between the conductive traces 531 and the first vias 511. Moreover, the switchable circuit chip 54 is also configured for controlling an electrical connecting relationship among the conductive traces 531.

The first external bumps 55 are disposed on a surface 51a of the substrate 51 located away from the conductive line layer 53 and electrically connected to the first vias 511. Some of the first vias 511 are not electrically connected to the second vias 521 and not electrically connected to the first external bumps 55, and thus are electrically floating.

The second external bumps 56 are disposed on a surface 53a of the conductive line layer 53 located away from the substrate 51 and electrically connected to the conductive traces 531. The switchable circuit chip 54 is electrically connected to some of the second external bumps 56 through the conductive traces 502, the third vias 522 and some of the conductive traces 531. Others of the conductive traces 531 electrically connect the second vias 521 and others of the second external bumps 56.

The operating chip 57 is disposed on the conductive line layer 53 and electrically connected to the second external bumps 56 through the second solders 92. The operating chip 57 is electrically connected to the switchable circuit chip 54 through the second solders 92, the second external bumps 56, the conductive traces 531, the third vias 522, and the conductive traces 502. The external electronic element 58 is disposed on the conductive line layer 53 and electrically connected to the second external bumps 56 through the second solders 92. The external electronic element 58 is electrically connected to the switchable circuit chip 54 through the second solders 92, the second external bumps 56, the conductive traces 531, the third vias 522, and the conductive traces 502.

In the embodiment, an operation of the switchable circuit chip 54 and the operating chip 57 is similar to the operation of the switchable circuit chip 14 and the operating chip 17 as shown in FIG. 2, and thus the description thereof is not repeated. In another embodiment, the operation of the switchable circuit chip 54 and the operating chip 57 may be also similar to the operation of the switchable circuit chip 14' and the operating chip 17' as shown in FIG. 5, and thus the description thereof is not repeated.

Figure 10:
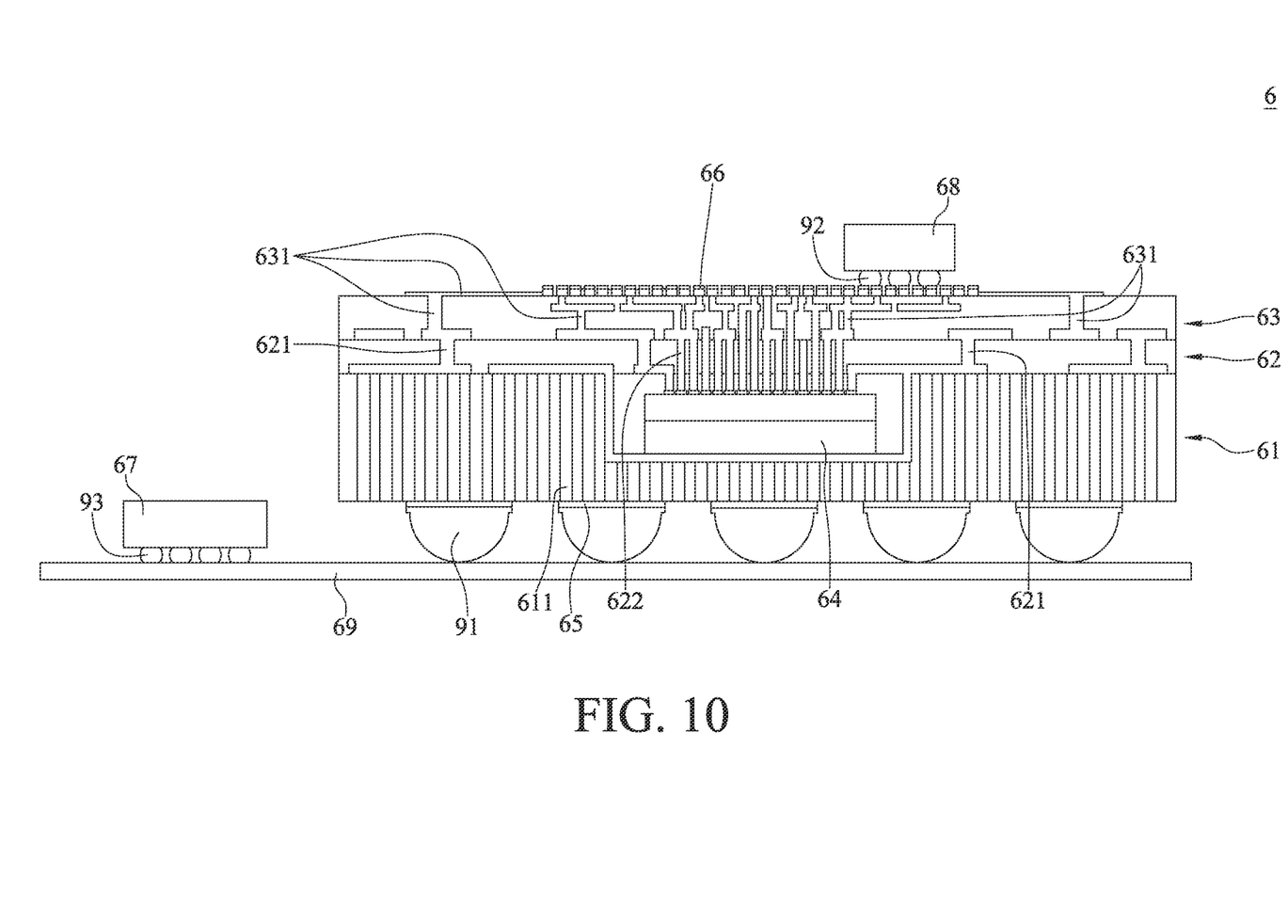
FIG. 10 illustrates a schematic cross-sectional view of an electronic device having a substrate according to another embodiment of the disclosure.

Please refer to FIG. 10. FIG. 10 illustrates a schematic cross-sectional view of an electronic device having a substrate according to another embodiment of the disclosure.

As shown in FIG. 10, in the embodiment, the electronic device 6 includes a substrate 61, an outer layer 62, a conductive line layer 63, a switchable circuit chip 64, a plurality of first external bumps 65, a plurality of second external bumps 66, an operating chip 67, an external electronic element 68, and a circuit board 69. In the embodiment, the substrate 61 and the first vias 611 thereof, the outer layer 62 and the second vias 621 and the third vias 622 thereof, the conductive line layer 63 and the conductive traces 631 thereof, the switchable circuit chip 64, the first external bumps 65, and the second external bumps 66 are respectively similar to the substrate 51 and the first vias 511 thereof, the outer layer 52 and the second vias 521 and the third vias 522 thereof, the conductive line layer 53 and the conductive traces 531 thereof, the switchable circuit chip 54, the first external bumps 55, and the second external bumps 56 as shown in FIG. 7, and thus the description thereof is not repeated.

Both of the operating chip 67 and the substrate 61 are disposed on the circuit board 69. The operating chip 67 is electrically connected to the switchable circuit chip 64 through the third solders 93, the circuit board 69, the first solders 91, the first external bumps 65, and the substrate 61. The external electronic element 68 is disposed on the conductive line layer 63 and electrically connected to the second external bumps 66 through the second solders 92. The external electronic element 68 is electrically connected to the switchable circuit chip 64 through the second solders 92, the second external bumps 66, and the conductive traces 631.

In the embodiment, an operation of the switchable circuit chip 64 and the operating chip 67 is similar to the operation of the switchable circuit chip 14 and the operating chip 17 as shown in FIG. 2, and thus the description thereof is not repeated. In another embodiment, the operation of the switchable circuit chip 64 and the operating chip 67 may be also similar to the operation of the switchable circuit chip 14' and the operating chip 17' as shown in FIG. 5, and thus the description thereof is not repeated.

According to the electronic device having the substrate as discussed in the above embodiments of the disclosure, the first vias have a larger distribution density or quantity than the second vias, such that the second vias disposed on the substrate can enable the installation of most types of external electrical components to the conductive line layer substrate while causing a part of the first vias to be electrically floating. Further, the electrical connecting relationship among the conductive traces, the first vias, the second vias, and the second external bumps can be flexibly controlled by the operation of the switchable circuit chip. That is, the above arrangement makes the electronic device having the substrate suitable for most types of external electrical components. Thus, the time and cost of developing and manufacturing electronic devices customized for different configurations of external electrical components are saved.

Although the disclosure is disclosed in the foregoing embodiments, it is not intended to limit the disclosure. All variations and modifications made without departing from the spirit and scope of the disclosure fall within the scope of the disclosure. For the scope defined by the disclosure, please refer to the attached claims.

What is claimed is:

1. An electronic device, comprising:
a substrate, having a plurality of first vias;
an outer layer, having a plurality of second vias, wherein the outer layer is disposed on a side of the substrate, and the first vias have a larger distribution density or quantity than the second vias, so that a part of the first vias are electrically connected to the second vias;
a conductive line layer, disposed on the outer layer, wherein the conductive line layer has a plurality of conductive traces, and at least one of the conductive traces is electrically connected to at least one of the second vias; and
a switchable circuit chip, electrically connected to at least one of the first vias, wherein at least one plurality of the conductive traces of the conductive line layer are electrically connected to the switchable circuit chip, and the switchable circuit chip is configured for controlling an electrical connecting relationship between at least one plurality of the conductive traces and at least one of the first vias;
wherein another part of the first vias are not electrically connected to the switchable circuit chip, and not electrically connected to the second vias, and thus are electrically floating;
wherein each of the second vias is electrically connected to more than one of the first vias.

2. The electronic device according to claim 1, wherein the switchable circuit chip is disposed on the substrate, the switchable circuit chip is disposed in the outer layer, the conductive line layer covers the switchable circuit chip and the outer layer, and the switchable circuit chip is directly electrically connected to at least one of the first vias.

3. The electronic device according to claim 1, wherein the switchable circuit chip is disposed on the outer layer, the conductive line layer covers the switchable circuit chip and the outer layer, and the switchable circuit chip is electrically connected to at least one of the first vias through at least one of the second vias.

4. The electronic device according to claim 1, wherein the substrate has a cavity, the switchable circuit chip is disposed in the cavity, the outer layer covers the switchable circuit chip and the substrate, the switchable circuit chip is directly electrically connected to at least one of the first vias, the outer layer further has a plurality of third vias, the third vias are electrically connected to the switchable circuit chip, and at least one plurality of the conductive traces of the conductive line layer are electrically connected to the switchable circuit chip through the third vias.

5. The electronic device according to claim 1, further comprising an operating chip, wherein the operating chip is disposed on the conductive line layer, the operating chip is electrically connected to the switchable circuit chip through at least one of the conductive traces of the conductive line layer, the switchable circuit chip comprises a switch array, the switch array provides a plurality of connecting path configurations, the operating chip comprises a memory unit and a controlling unit electrically connected to the memory unit, the memory unit stores a configuration command, and the controlling unit is configured for enabling one of the connecting path configurations according to the configuration command.

6. The electronic device according to claim 1, further comprising an operating chip, wherein the operating chip is electrically connected to the substrate, the operating chip is electrically connected to the switchable circuit chip through the substrate, the switchable circuit chip comprises a switch array, the switch array provides a plurality of connecting path configurations, the operating chip comprises a memory unit and a controlling unit electrically connected to the memory unit, the memory unit stores a configuration command, and the controlling unit is configured for enabling one of the connecting path configurations according to the configuration command.

7. The electronic device according to claim 1, further comprising an operating chip, wherein the operating chip is disposed on the conductive line layer, the operating chip is electrically connected to the switchable circuit chip through at least one of the conductive traces of the conductive line layer, the switchable circuit chip comprises a switch array and a controlling unit electrically connected to the switch array, the switch array provides a plurality of connecting path configurations, the operating chip comprises a memory unit, the memory unit stores a configuration command, and the controlling unit is configured for enabling one of the connecting path configurations according to the configuration command.

8. The electronic device according to claim 1, further comprising an operating chip, wherein the operating chip is electrically connected to the substrate, the operating chip is electrically connected to the switchable circuit chip through the substrate, the switchable circuit chip comprises a switch array and a controlling unit electrically connected to the switch array, the switch array provides a plurality of connecting path configurations, the operating chip comprises a memory unit, the memory unit stores a configuration command, and the controlling unit is configured for enabling one of the connecting path configurations according to the configuration command.

9. The electronic device according to claim 1, wherein the outer layer comprises a first dielectric contacting each of the second vias and made of a polymer or a molding compound, and the conductive line layer comprises a second dielectric contacting each of the conductive traces and made of the polymer or the molding compound.

10. The electronic device according to claim 9, wherein the polymer is selected from a group consisting of polybenzoxazole and polyimide.

11. The electronic device according to claim 1, further comprising a plurality of first external bumps and a plurality of a second external bumps, wherein the first external bumps are disposed on a surface of the substrate located away from the conductive line layer and electrically connected to the first vias, and the second external bumps are disposed on a surface of the conductive line layer located away from the substrate and electrically connected to the conductive traces.

12. The electronic device according to claim 11, further comprising at least one external electronic element, wherein the at least one external electronic element is disposed on the conductive line layer, the at least one external electronic element is electrically connected to at least one of the second external bumps through at least another one of the second external bumps, at least one of the conductive traces of the conductive line layer, the switchable circuit chip, and at least another one of the conductive traces.

13. The electronic device according to claim 11, further comprising at least one external electronic element, wherein the at least one external electronic element is disposed on the conductive line layer, the at least one external electronic element is electrically connected to at least one of the first external bumps through at least one of the second external bumps, at least one of the conductive traces of the conductive line layer, the switchable circuit chip, and at least one of the first vias.

14. The electronic device according to claim 11, further comprising a plurality of external electronic elements, wherein the external electronic elements are disposed on the conductive line layer, the external electronic elements are electrically connected to each other through at least one plurality of the second external bumps, at least one plurality of the conductive traces of the conductive line layer, and the switchable circuit chip.

15. The electronic device according to claim 11, further comprising at least one external electronic element, wherein the at least one external electronic element is disposed on the conductive line layer, the at least one external electronic element is electrically connected to at least one of the first external bumps through at least one of the second external bumps, at least one of the conductive traces of the conductive line layer, and at least one of the first vias.

16. The electronic device according to claim 11, further comprising at least one external electronic element, wherein the at least one external electronic element is disposed on the conductive line layer, the at least one external electronic element is electrically connected to at least one of the second external bumps through at least another one of the second external bumps and at least one of the conductive traces of the conductive line layer.

17. The electronic device according to claim 1, wherein each of the first vias is solid.

18. The electronic device according to claim 1, wherein the first vias are arranged in an array.

19. The electronic device according to claim 1, wherein each of the first vias has an outer diameter ranging from 5 µm to 100 µm.

20. The electronic device according to claim 1, wherein a center distance between every two of the first vias adjacent to each other is in micrometer scale.

21. The electronic device according to claim 1, wherein the substrate comprises a core layer made of a material selected from a group consisting of a semiconductor material and a non-conductive material.

22. The electronic device according to claim 1, wherein the substrate comprises a core layer made of a material selected from a group consisting of silicon, gallium, germanium, gallium nitride, and epoxy resin.

* * * * *